United States Patent [19]
Wada et al.

[11] Patent Number: 5,584,973
[45] Date of Patent: Dec. 17, 1996

[54] PROCESSING APPARATUS WITH AN INVERTIBLE COLLIMATOR AND A PROCESSING METHOD THEREFOR

[75] Inventors: Yuichi Wada; Jiro Katsuki; Hiroshi Kobayashi, all of Kofu, Japan

[73] Assignee: TEL Varian Limited, Yamanashi-Ken, Japan

[21] Appl. No.: 467,148

[22] Filed: Jun. 6, 1995

[30] Foreign Application Priority Data

Jun. 8, 1994 [JP] Japan .................................. 6-151511

[51] Int. Cl.$^6$ .................................................. C23C 14/34
[52] U.S. Cl. .............................. 204/192.12; 204/192.17; 204/298.11
[58] Field of Search ..................... 204/192.12, 192.17, 204/298.11

[56] References Cited

FOREIGN PATENT DOCUMENTS 4-32568  2/1992  Japan .
4-193948 7/1992  Japan ........................... 204/298.11

*Primary Examiner*—Aaron Weisstuch
*Attorney, Agent, or Firm*—Beveridge, DeGrandi, Weilacher & Young, LLP

[57] ABSTRACT

A processing apparatus wherein a collimator which restricts sputtering directions of sputtered particles from a target comprises a plurality of slats arranged substantially parallel with each other. The respective slats constitute a louver mechanism in which rotatable rods are rotated to replace the side thereof facing the target and the side thereof facing the object-to-be-processed with each other. Because of the louver mechanism, the portion of the interior of a processing vessel belonging to the target and the portion thereof belonging to the object-to-be processed can be closed off from each other, and a side of the collimator facing the target and a side thereof facing the object-to-be-processed can be replaced with each other. As a result, the collimator has also a shutter function, and can suppress generation of particles.

12 Claims, 8 Drawing Sheets

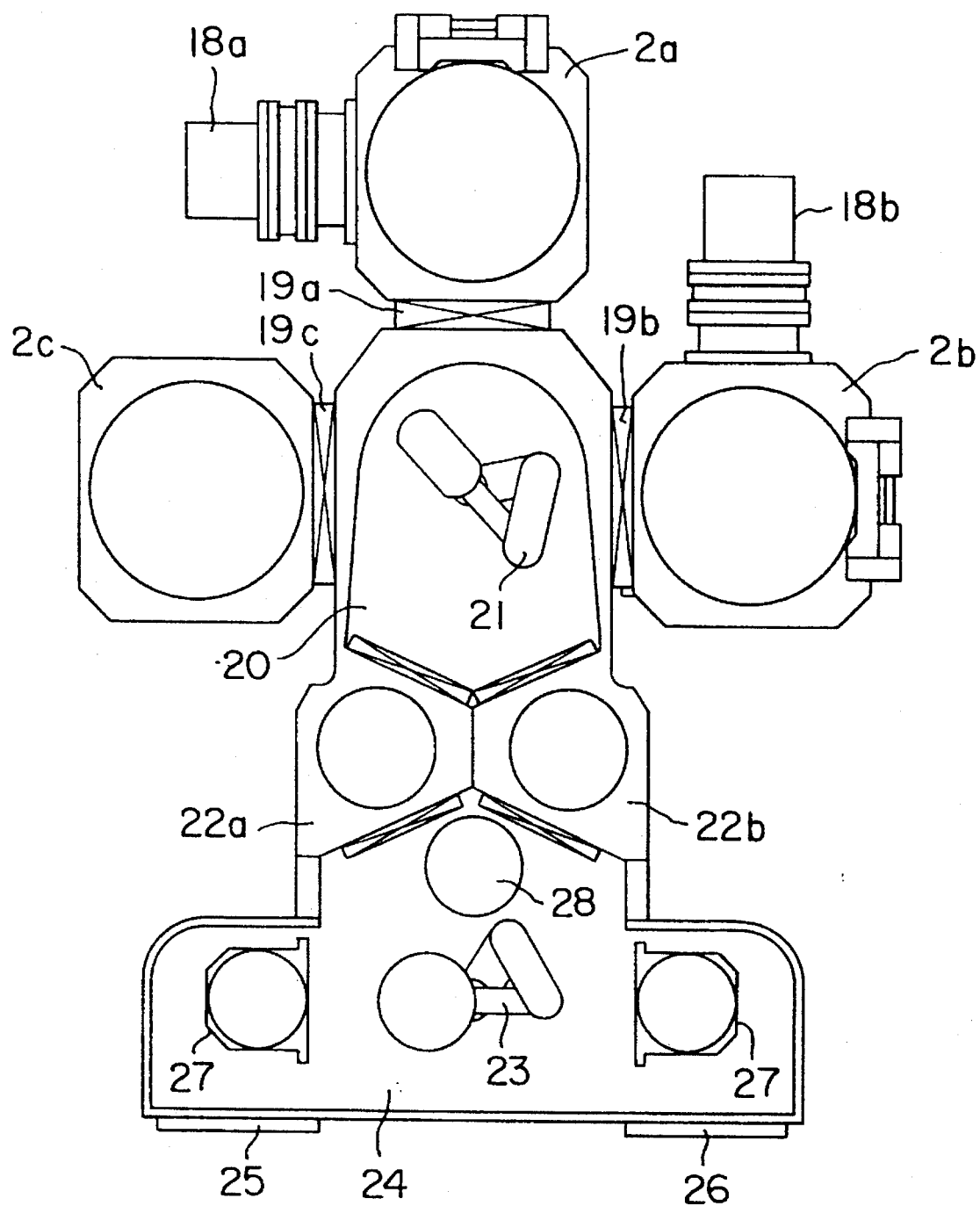
F I G. 2

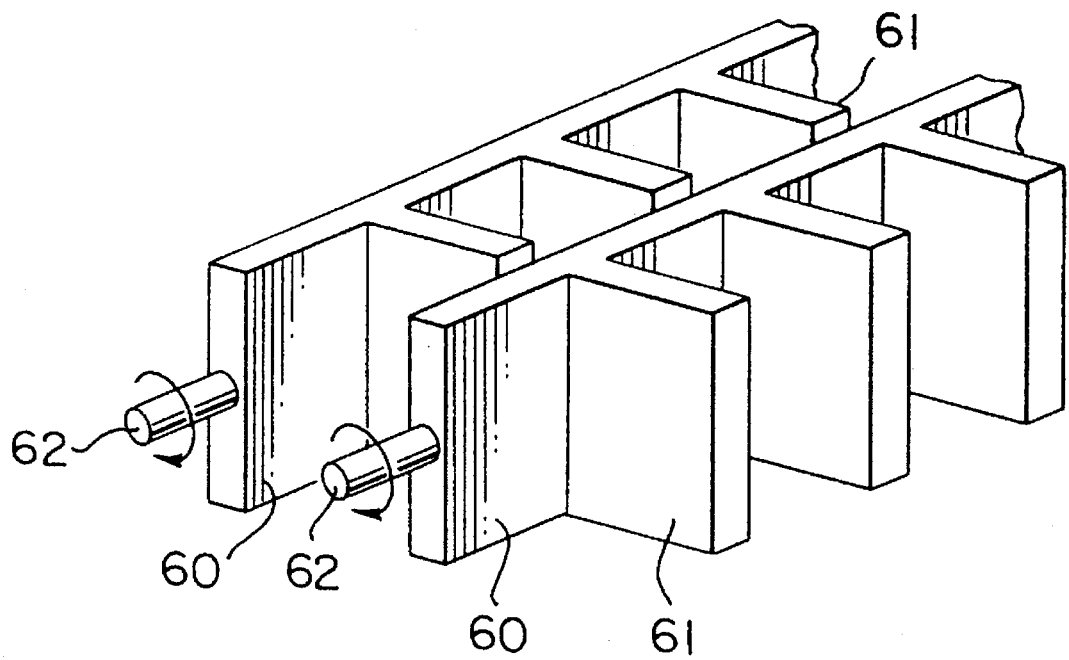
F I G. 9A
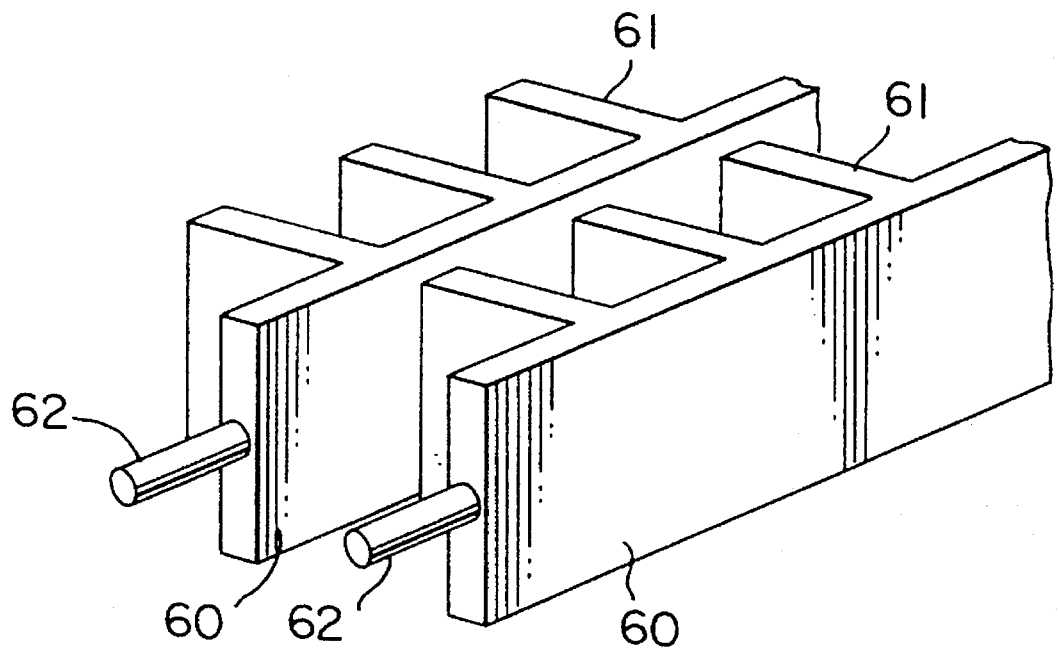
F I G. 9B

PROCESSING APPARATUS WITH AN INVERTIBLE COLLIMATOR AND A PROCESSING METHOD THEREFOR

BACKGROUND OF THE INVENTION

1. Field of the Invention

The present invention relates to a processing apparatus and a processing method, more specifically to a processing apparatus including an invertible collimator optimum for titanium sputtering or reactive sputtering of titanium nitride, and a method using the processing apparatus.

2. Description of the Prior Art

A semiconductor device fabrication process conventionally uses a sputtering system to form electrodes on objects to be processed, such as semiconductor wafers, and to wire the objects. The objects are positioned opposed to a target of a required film forming material in a processing chamber the interior of which is kept in a required low pressure atmosphere, whereby particles sputtered from the target are applied to the objects.

Accompanying the recent high density integration of semiconductor devices, techniques for accurate micron sized processing during their fabrication processes are required to be developed. In internal wiring processing using sputtering systems, for example, it is necessary to fill contact holes having small diameters and large depths, i.e., high aspect ratios, with sputtered particles. But generally the known sputtering processes have low step coverage characteristics, and as the cavities of the contact holes have larger aspect ratios, wiring discontinuities tend to occur at the bottom of the holes. This is a problem of the conventional technology.

As a countermeasure to this problem there has been recently used a sputtering system including a collimator 5 which comprises, as shown in FIGS. 10 and 11, a plurality of circular through-holes 5a or a honeycomb of through-holes FIG. formed through a metal plate of, e.g., steel, or an insulating plate made of ceramic. The collimator 5 is positioned between a target and objects to be processed to restrict the directions of travel of the sputtered particles in a $\cos \theta$ distribution from the target so that only selected particles substantially perpendicularly bombard the surfaces of the objects to be processed, whereby improved step coverage is obtained. By the use of such collimator, a step coverage is obtained which is improved by about three times the usual step coverage for contact holes of aspect ratios of above 3.0 which are required in the fabrication of, e.g., 64M DRAMs.

But collimators used in sputtering systems for the improvement of step coverage sometimes cause large amounts of particles, depending on materials of the collimators, to be formed. For example, in forming an ohmic contact layer between an electrode/wiring material, and silicon, as shown in FIG. 12, a titanium film 73 as a contact layer is formed on a silicon substrate 70, and a titanium nitride film 74 is formed as a barrier layer for prevention of reaction between the electrode/wiring material and the silicon, and as an adhesion layer, when the electrode/wiring material is CVD tungsten 75. But a problem is that titanium nitride, which is stable and hard to react, has poor adhesion and more easily peels than titanium, causing particles to be formed.

Titanium nitride is generally sputtered by reactive sputtering, because titanium nitride as a target material is not commercially available. In this reactive sputtering, discharge is conducted with argon and nitrogen gases, which are usual sputtering gases, being introduced into a processing chamber at required flow rates to nitrify the titanium near the surface of the target or the surfaces of the wafers to form titanium nitride films. But because titanium, which is unstable and active, tends to be contaminated by a residue of the gases in vacuum, titanium sputtering and titanium nitride reactive sputtering cannot be conducted by using one and the same titanium target. Accordingly, the sputtering and the reactive sputtering must be conducted in different processing chambers, or the surface of the target must be cleaned before the titanium sputtering, which has been a serious barrier to improvement of productivity.

SUMMARY OF THE INVENTION

The present invention was made in view of the above-described problems of the sputtering system with the conventional collimator, and an object of the present invention is to provide an innovative and improved processing apparatus which can decrease generation of particles from the collimator and in which the collimator also has a shielding function of blocking undesired sputtered particles which occur when alternating sputtering of titanium and reactive sputtering of titanium nitride.

To solve the above-described problems, the processing apparatus according to the present invention comprises a target arranged in a processing vessel so as to be opposed to an object to be processed; and a collimator arranged opposed to the target for restricting the directions of sputtered particles from the target so as to adhere the sputtered particles to the object to be processed, the collimator including inverting means which can invert the collimator to replace the side thereof facing the target and the side thereof facing to the object-to-be-processed with each other.

In conducting sputtering by the processing apparatus with a collimator of the present invention, the side of the collimator facing the target and the side facing an object to be processed are replaced with each other, so that adhesion of sputtered particles on the inside walls of the through-holes of the collimator can be made uniform, and particles which easily peel off are covered with particles which are hard to peel off, whereby higher adhesion can be obtained. As a result, generation of particles caused by sputtered particles adhered to the collimator can be reduced or suppressed.

BRIEF DESCRIPTION OF THE DRAWINGS

FIG. 2 is a schematic plan view of a semiconductor fabrication apparatus of multi-chamber type provided with the sputtering system of FIG. 1.

FIGS. 9A and 9B are perspective views of another embodiment of the collimator used in the processing apparatus of the present invention.

DETAILED DESCRIPTION OF THE PREFERRED EMBODIMENTS

One embodiment of the present invention which is applied to a magnetron sputtering system for formation of titanium/titanium nitride films will be explained in detail with reference to the drawings attached hereto.

Figure 1:
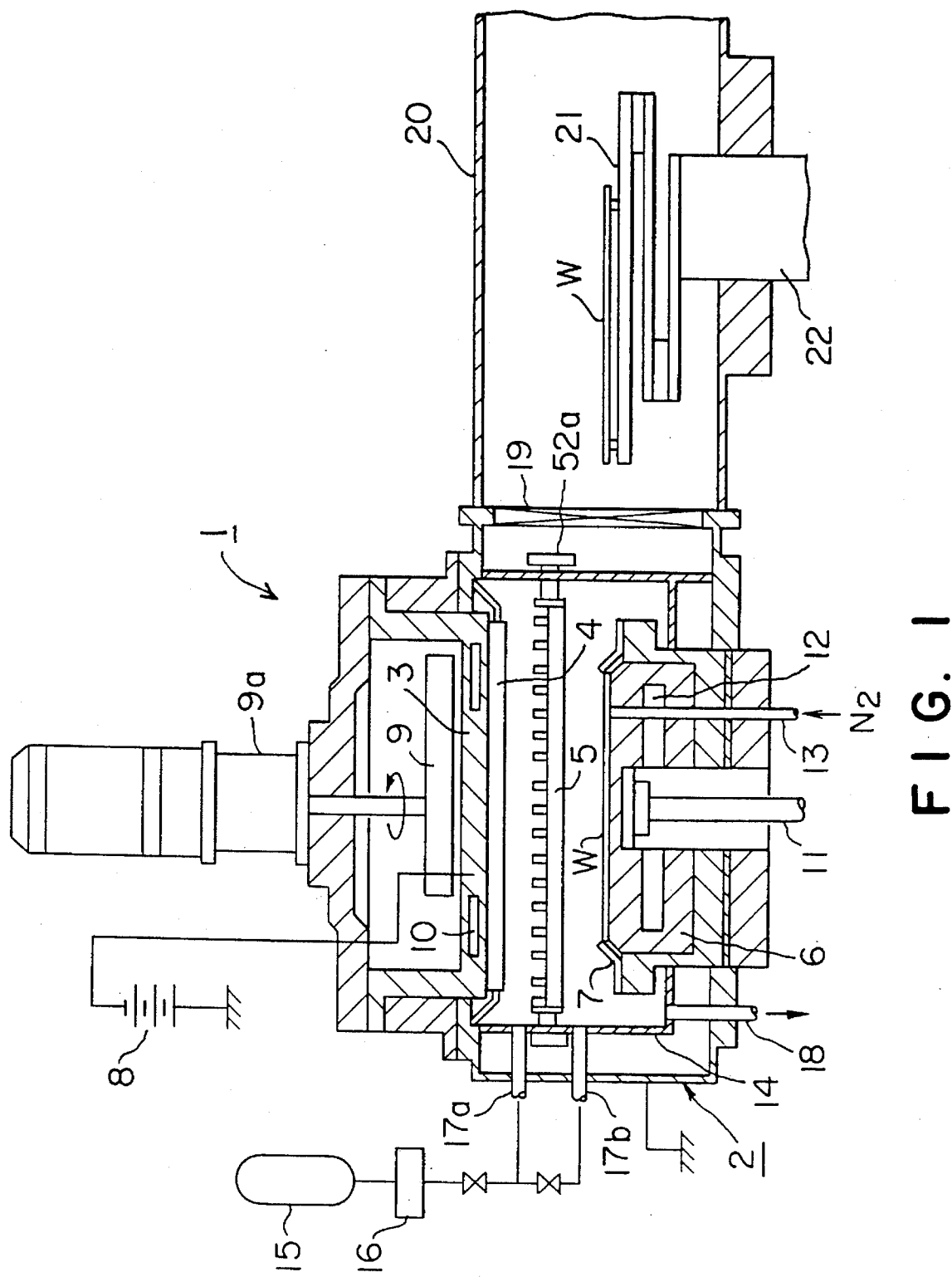
FIG. 1 is a schematic vertical sectional view of a DC magnetron sputtering system according to one embodiment of the present invention to which the processing apparatus of the present invention is applied.

As shown in FIG. 1, the sputtering system 1 includes a barrel-shaped processing vessel 2 of stainless steel or aluminum. In the processing vessel 2, a cathode 3, a target 4, a collimator 5 and an anode 6 are arranged opposed to each other in the stated order from above. The anode 6 functions also as mount which holds an object-to be processed W (semiconductor wafer) thereon. The semiconductor wafer is mounted on the mounting surface, secured by a chuck 7.

The cathode 3 made of a conductive material is connected to a d.c. high voltage source 8. During sputtering, d.c. electric power of, e.g., 10 KW to 20 KW is applied to the cathode 3 to generate glow discharge between the cathode 3 and the anode 6. Ionized particles are generated and caused by the glow discharge to collide with the target 4 adhered to the underside of the cathode 3, and particles sputtered from the target 4 are caused to adhere to the surface of the object to be processed W mounted opposed to the target 4. A permanent magnet 9 which is rotated by drive means 9a is disposed above the cathode 3. The permanent magnet 9 forms a transverse electromagnetic field near the cathode 3 to trap secondary ions so as to enhance the ionization. A cooling jacket 10 is incorporated in the cathode 3. A coolant, e.g., cooling water, is circulated in the jacket so as to suppress temperature rise of the cathode 3 and the target.

The material of the target 4 opposed to the object to be processed W is selected in accordance with the thin films to be formed on the object to be processed W. Materials of the thin films to be formed on the semiconductor wafer W by the sputtering are, e.g., aluminum, silicon, tungsten, titanium, molybdenum, chrome, cobalt, nickel, etc., and their alloys. The target 4 may have various shapes, such as stepped sectional shapes, circular shapes, conical shapes, rectangular, pyramidal, and other shapes.

The mount 6 of a conductive metal, such as aluminum, which is also the anode 6, is disposed at a lower part in the processing vessel 2. The mount is substantially cylindrical and is raised by a lift mechanism 11, and has heating means 12, e.g., a heater, built in, so that the object to be processed W can be heated to a required temperature, e.g., 200° C. A pipe 13 supplies nitrogen gas, etc. to the underside of the object to be processed W to improve the heat conduction characteristic of the heating means 12.

The collimator 5 is disposed between the cathode 3 and the target 4, and the anode (the mount) 6. As shown in FIGS. 3 to 6, the collimator comprises a plurality of slats 50 (20–30 mm width and 0.5 mm thickness) of stainless steel arranged substantially parallel with each other, and a plurality of slats 51 (20–30 mm width and 0.5 mm thickness) of stainless steel arranged substantially parallel with each other, the slats 50 being laid on the slats 51 in two stages. Further, the respective slats 50 have rotatable rods 52, and the respective slats 51 have rotatable rods 53. The rotatable rods 52 and the rotatable rods 53 are journalled in the processing vessel 2 by means of their respective magnetic seal bearings and are rotated by associated rotatable drive mechanisms 54, 55 by means of respective SUS belts 52b; 53b and respective SUS pulleys 52a; 53a, whereby the slats 50 and the slats 51 are formed respectively as louver type structures.

Figure 5:
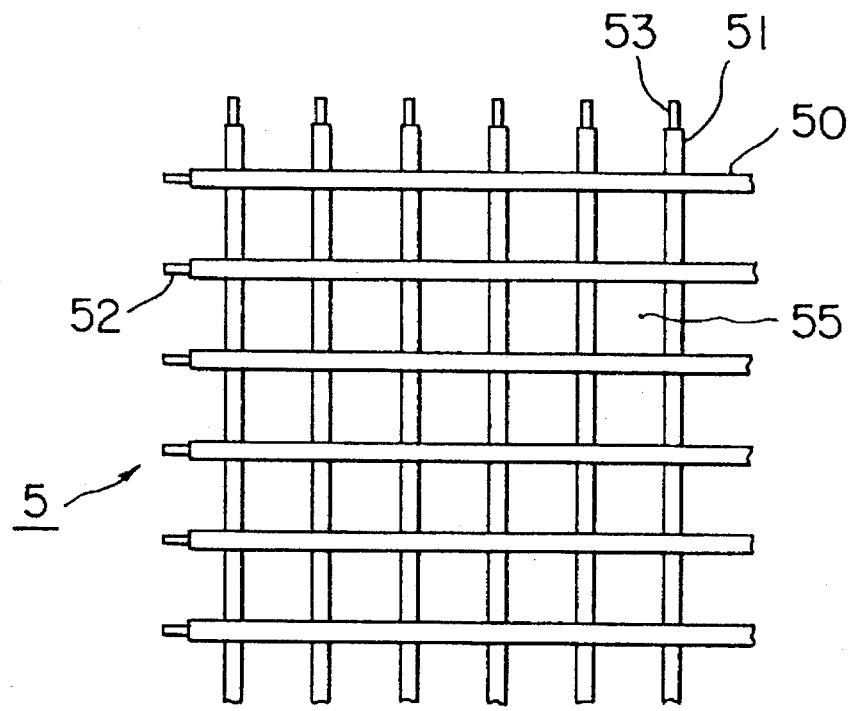
FIG. 5 is a schematic plan view of the collimator of FIG. 3 in a state where the collimator is opened to pass sputtering particles therethrough.
Figure 6:
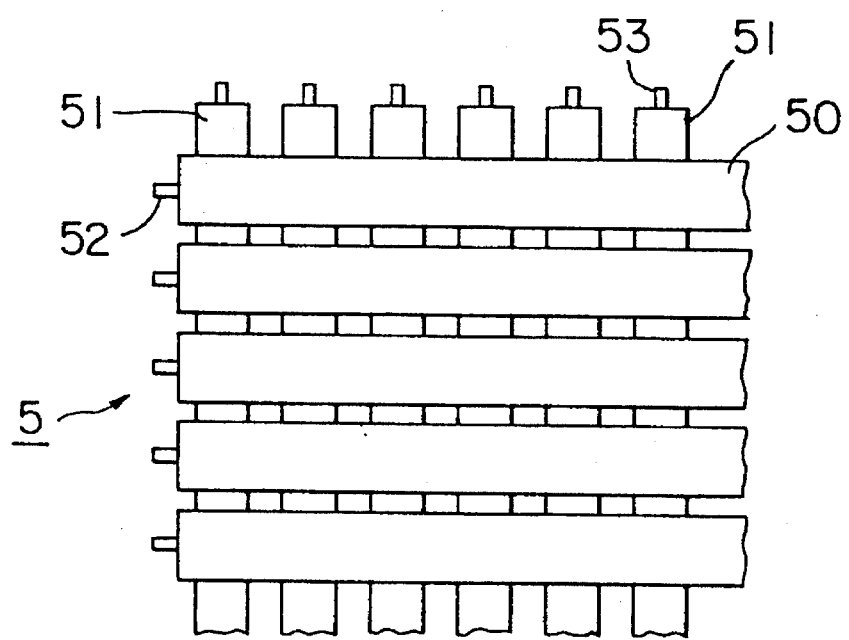
FIG. 6 is a schematic plan view of the collimator of FIG. 3 in a state in which the collimator is closed to block sputtering particles.

The respective slats 50, 51 are arranged at a pitch which keeps them from contacting their adjacent ones when they are rotated. Preferably, as shown in FIGS. 5 and 6, the slats 50, 51 are arranged at a pitch which permits the slats 50, 51 to form shielding plates which substantially shield the target 4 from the object to be processed W when all the slats 50, 51 are rotated by 90°. The rotational drive mechanisms 54, 55 may be usual motors or air cylinders.

Figure 3:
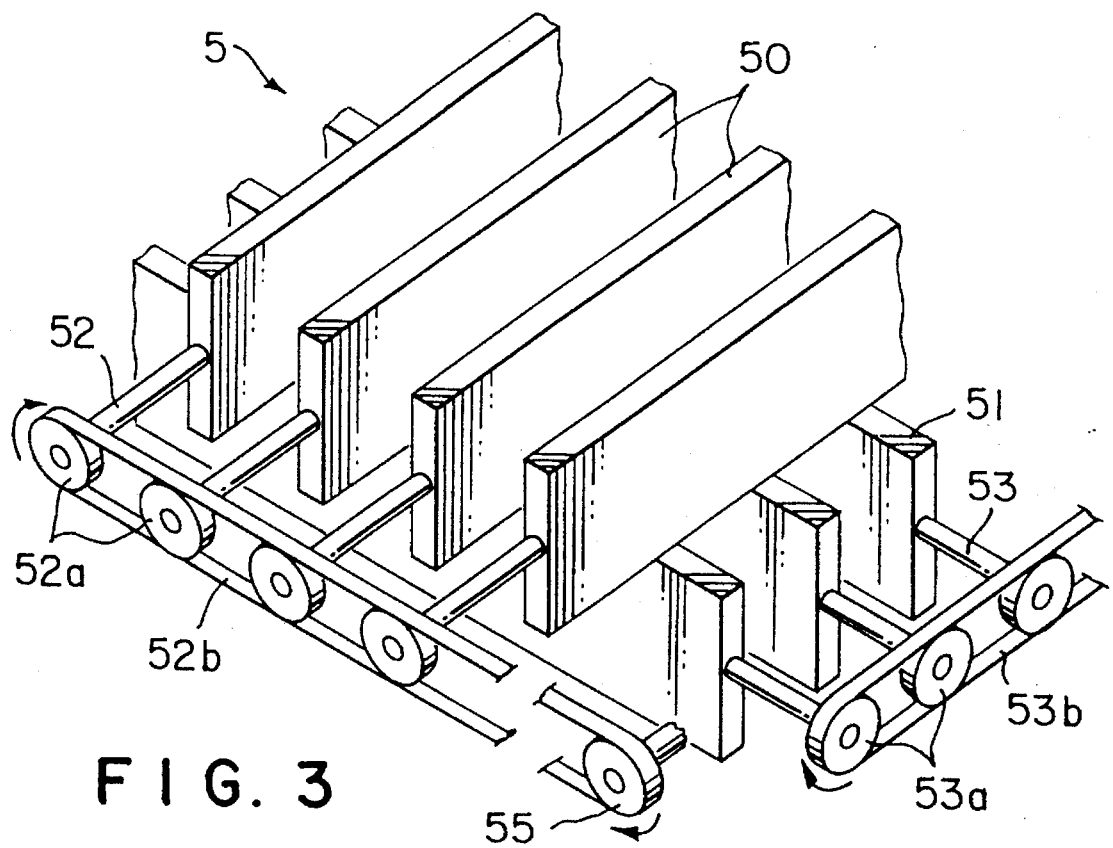
FIG. 3 is a schematic perspective view of a collimator provided in the sputtering system of FIG. 1.
Figure 4:
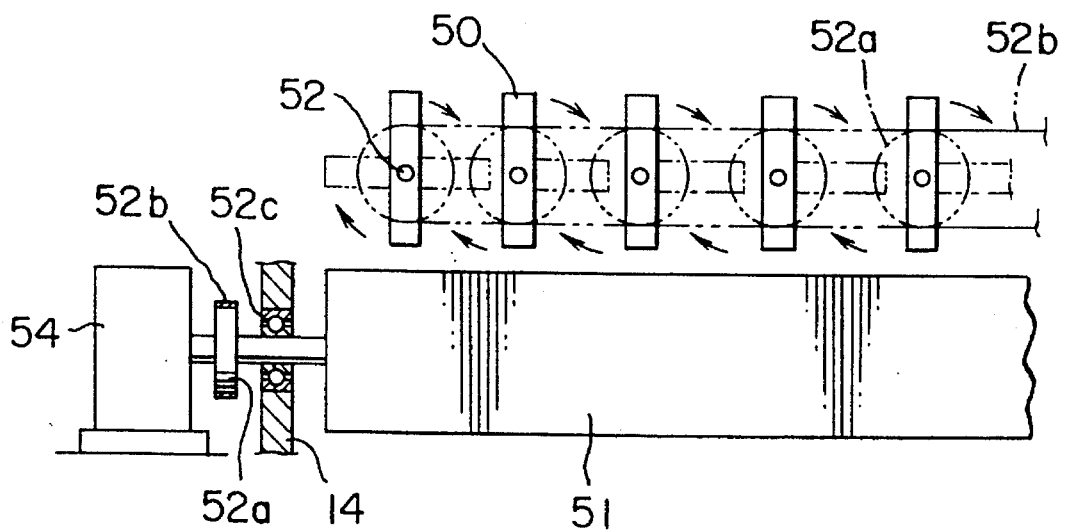
FIG. 4 is a schematic side view of the collimator of FIG. 3.

As shown in FIG. 3, the slats 50 of the upper stage cross those 51 of the lower stage, whereby substantially square sectioned through-holes 55 (openings) of 20 mm square are defined by the slats 50, 51. Sputtered particles pass through the through-holes 55, so that only those sputtered particles which will be incident substantially normally on the object to be processed W are transmitted, and step coverage can be improved. It is possible for the surfaces of the slats 50, 51 to be machined rough (around 200S) by sand blasting for the prevention of peeling of the coating, and the corners of the slats 50, 51 may be rounded.

According to the present invention, the slats 50, 51 are respectively rotated by 90° and stopped at their shielding positions so that they can function as shutters during pre-sputtering. That is, the slats 50, 51 function as louver mechanisms.

According to the present invention, as will be described later, in a case where different films are formed on the upper side of the collimator 5 and the underside thereof, the slats 50, 51 are further rotated so that the side of the slats 50, 51 facing the target 4 and that facing the object to be processed W exchange their positions with each other, whereby a film which has poor adhesion and easily peels off, e.g., a titanium nitride film is coated with a film which has good adhesion and does not easily peel off, e.g., a titanium film for preventing or suppressing occurrence of particles.

As shown in FIG. 1, a shield 14 of, e.g., stainless steel is provided inside the processing vessel 2, enclosing a space from the cathode 3 to the anode (the mount) 6 in which sputtered particles travel, whereby the inside wall of the processing vessel 2 is protected from sputtered particles.

As shown in FIG. 1, a first process gas feed pipe 17a and a second process gas feed pipe 17b are connected to the processing vessel 2 for supplying the required process gases from gas sources 15 through mass flow controller 16.

For example, it is possible that an inert gas, such as argon gas, is supplied into the processing vessel 2 through the first pipe 17a, and a reactive gas, such as nitrogen, can be supplied into the processing vessel 2 through the second pipe 17b. An exhaust port 18 (18a, 18b) is provided in the bottom of the processing vessel 2, so that the interior of the processing vessel 2 can be evacuated to a required pressure by a vacuum pump, e.g., a dry pump not shown.

As shown in FIG. 1, a workpiece feeding chamber 20 is provided via a gate valve 19 on one side of the processing vessel 2. A multi-chamber semiconductor fabrication apparatus is thus constituted. A transfer mechanism 22 with a transfer arm 21 is provided in the transfer chamber 20.

As shown in FIG. 2, in a multi-chamber semiconductor fabrication apparatus, a plurality of processing vessels 2a, 2b, 2c for various processing steps, such as sputtering, etching, etc. are connected to sides of the transfer chamber 20 respectively through gate valves 19a, 19b, 19c. A loader/unloader chamber 24 provided with a carrier arm 23 is connected to one side of the transfer chamber 22 through pre-vacuum chambers 22a, 22b. The loader/unloader chamber 24 has a loader opening 25 and an unloader opening 26. Through the loader and the unloader openings 2S, 26 a wafer cassette 27 holding a set number of sheets, e.g., 25 sheets of objects to be processed W is loaded and unloaded.

The DC magnetron sputtering system according to one embodiment of the present invention has such structure. The operation of same in the steps of forming a titanium film 73/a titanium nitride film 74 in a contact hole 72 formed in an insulation layer 71 between silicon oxide layers on silicon 70 of a semiconductor wafer W (FIG. 12) will now be explained.

A semiconductor wafer W with a silicon oxide film formed thereon beforehand is taken, by the carrier arm 23, out of the cassette 27 placed in the loader/unloader chamber 24, and then is positioned by positioning means 28 based on a flat orientation, and is loaded into a pre-vacuum chamber 22a. The transfer arm 21 in the transfer chamber 20 receives the wafer W and loads the wafer into a processing vessel, the etching processing chamber 2a. There a required contact hole is etched in the inter-layer insulation layer 71 of silicon oxide.

After the etching is over, the transfer arm 21 unloads the wafer W from the etching vessel 2a and loads the wafer into the sputtering processing chamber 2b (the processing chamber 2 in FIG. 1, which is constituted according to the present invention) onto the mount 6 and the wafer W is secured by the chuck 7. Then the interior of the processing chamber 2 is evacuated to, e.g., $10^{-2}$–$10^{-3}$ Torr while argon gas is fed into the processing chamber 2 through the gas feed pipe 17a, the semiconductor wafer W being heated by the heater 12 up to a required temperature, e.g., 200° C. Then, DC high-voltage power of 10 KW to −20 KW, for example, is applied to the cathode 3 to generate glow discharge between the cathode 3 and the anode 6. The glow discharge causes ionized particles to impinge on the target 4 of titanium adhered to the underside of the cathode 3, and the titanium particles sputtered from the target 4 are adhered to the processing surface of the wafer W, opposed to the target 4. Secondary ions are trapped by transverse electromagnetic field formed near the cathode by the permanent magnet 9 to enhance the ionization. A coolant, e.g., cooling water, is circulated in the cooling jacket 10 built into the cathode 3 to suppress temperature rise of the cathode 3 and the target.

Figure 12:
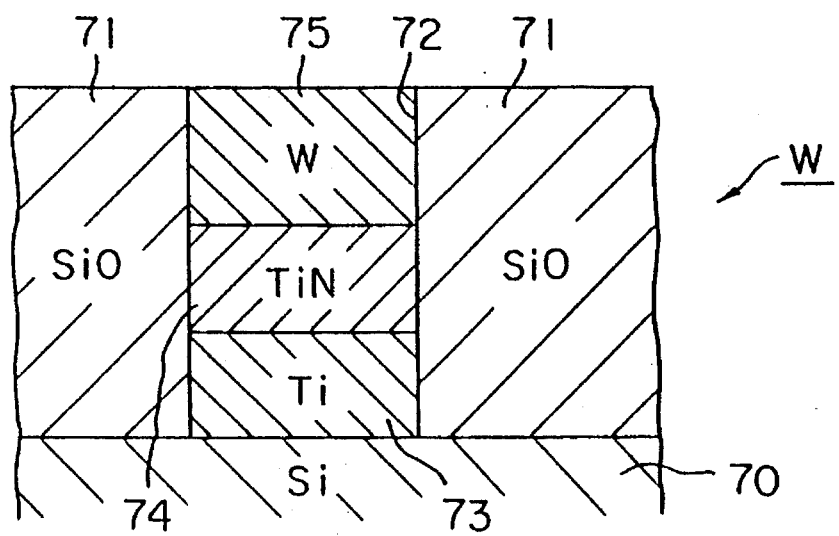
FIG. 12 is an explanatory view of the steps of filling tungsten in a contact hole formed in an inter-layer insulation film.

When the titanium particles thus sputtered from the titanium target 4 reach the collimator 5, only substantially normal components are selected to pass through, so that the though-hole 72 formed in the inter-layer insulation layer 71 shown in FIG. 12 is filled to a required depth, and the ohmic contact layer 73 is formed with good step coverage. Then, when the titanium nitride film 74 as a barrier layer is formed on the titanium layer 73, as shown in FIG. 12, nitrogen gas is fed into the processing vessel 2 through the gas feed pipe 17b to nitrify the titanium near the wafer W and adhere the titanium nitride film 74 to the titanium layer 73. After this sputtering operation is over, the wafer W is unloaded from the sputtering processing vessel 2b also by the transfer arm 21 into the processing vessel 2c for CVD as shown in FIG. 2. There the tungsten layer 75 is formed on the titanium nitride layer 74 by CVD, and a connection hole with a wiring material of tungsten filling the contact hole 72 is completed.

The wafer W which has been subjected to this flow of operations, is then unloaded from the CVD processing vessel 2c also by the transfer arm 21 in the transfer chamber 20 into the pre-vacuum chamber 22b. The wafer W which has been transferred to the carrier arm 23 in the loader/unloader chamber 24 is again put into the cassette 27 to be carried out of the apparatus through the unloader opening 26.

Meanwhile a next wafer W is being processed in the sputtering processing chamber 2 (2b). But the surface of the titanium target is contaminated by nitrogen gas after the reactive sputtering of titanium nitride, and the surface of the target must be cleaned before the titanium layer is formed on the wafer W. To this end, according to this embodiment of the present invention, the respective slats 50, 51 are rotated by 90° by the rotational drive mechanism 54 of the collimator 5. The collimator 5 can also be a shielding mechanism or a shutter which shields the target from the object to be processed. As a result, the respective slats 50, 51 are simply rotated to their shielding positions, whereby the shielding for the pre-sputtering is possible without providing an extra shutter mechanism. When the cleaning of the surface of the target 4 is over, the slats 50, 51 are again rotated by 90° when the wafer temperature has reached a set value, and the glow discharge is stable, to again open the through-holes 55 for the sputtered particles. The films thus can be formed in the contact hole in the object (wafer) W with good step coverage.

Figure 7A:
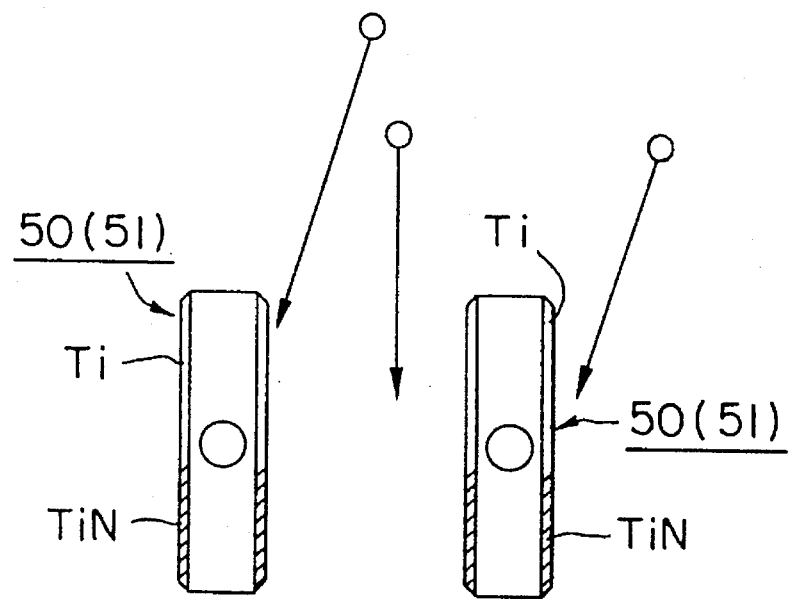
FIG. 7A is a view of a state, in a case where a titanium film/titanium nitride film structure is formed by the use of the collimator of FIG. 3, of the films formed on the collimator, the titanium film being adhered to the side of the collimator facing the target, and the titanium nitride film being adhered to the side of the collimator faced to an object to be processed.
Figure 7B:
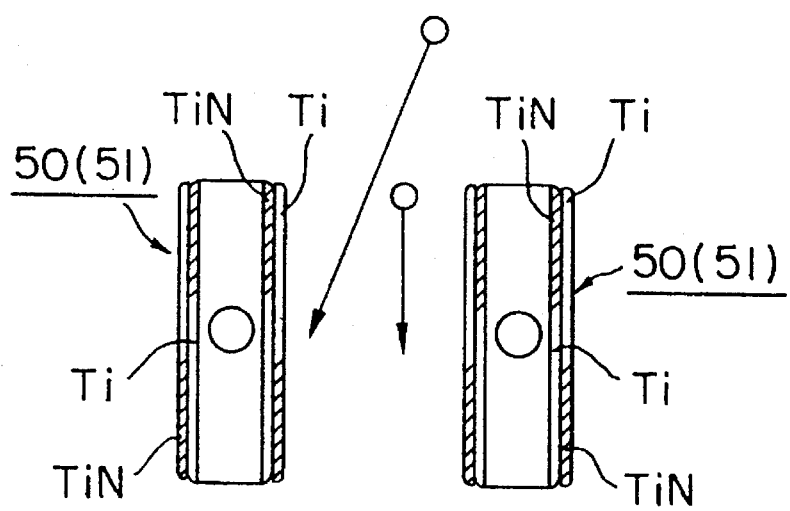
FIG. 7B is a view of a state of the titanium film formed on the titanium nitride film which has been brought to face the target when the collimator was rotated to replace the side facing the target and the side facing the object with each other.

In sequentially repeatedly conducting film forming processing on a number of objects-to-be-processed by the apparatus of FIG. 1 by the sputtering of titanium and reactive sputtering of titanium nitride by feeding nitrogen gas near an object to be processed, it is often the case that, as shown in FIG. 7A, a titanium film is adhered to the surfaces of the respective slats 50, 51 faced to the target, and a titanium nitride film is adhered to the surfaces thereof facing the objects. In this case, the titanium on the respective slats 50, 51 has high adhesion thereto because titanium is relatively active, but the titanium nitride on the respective slats 50, 51 tends to peel off, possibly causing particle formation because of poor adhesion of titanium nitride to a base. As a countermeasure to this, according to the present invention, the respective slats 50, 51 are rotated at a required timing to replace the surfaces of the slats 50, 51 facing the target and the objects-to-be-processed with each other, as shown in FIG. 7B, and resuming the sputtering. Thus a titanium film, which has good adhesion, can be formed on a titanium nitride film which has formed on the reverse side of the slats, whereby generation of particles can be minimized.

As regards the timing of reversing of the collimator 5, the collimator 5 can be automatically reversed at a set time of a time cycle or after a number of objects-to-be-processed empirically determined based on a total processing period of time for forming the titanium nitride films, which possibly cause particles, or a number of objects to be processed. Otherwise, a particle counter is provided in the apparatus, and the collimator 5 is reversed when the counted value given by the particle counter has reached a set threshold value.

Figure 8A:
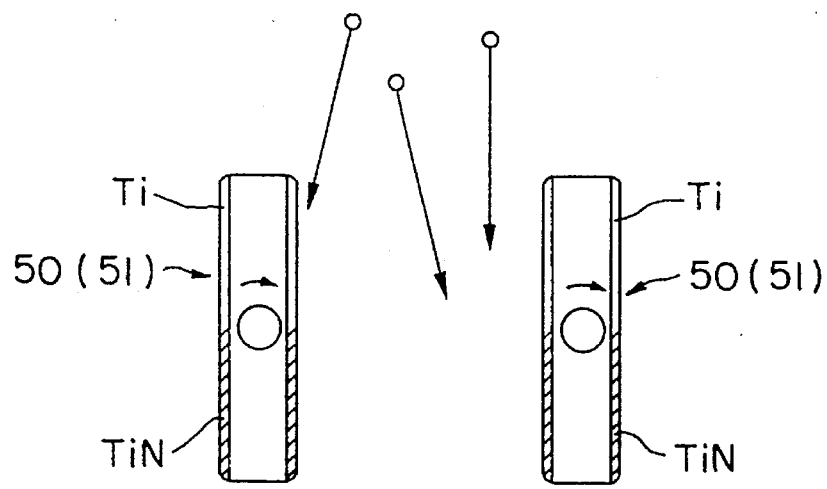
FIG. 8A to 8D are views of another state, when a titanium film/titanium nitride film structure is formed as in FIGS. 7A and 7B, of the titanium film and the titanium nitride film formed on the collimator.
Figure 8B:
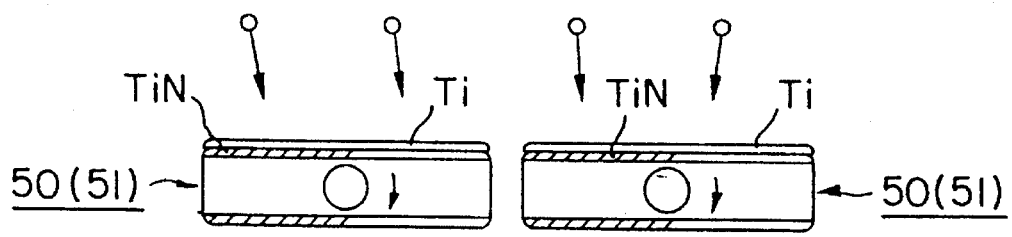
Figure 8C:
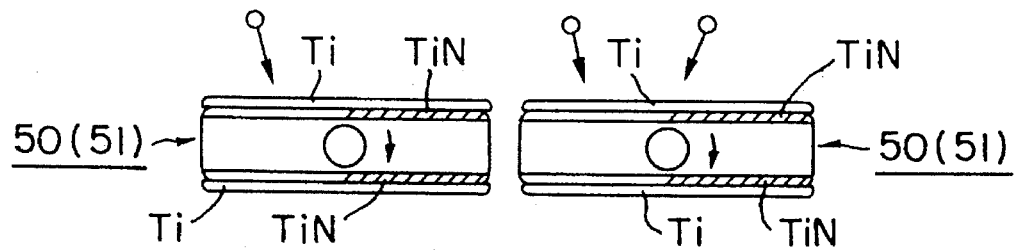
Figure 8D:
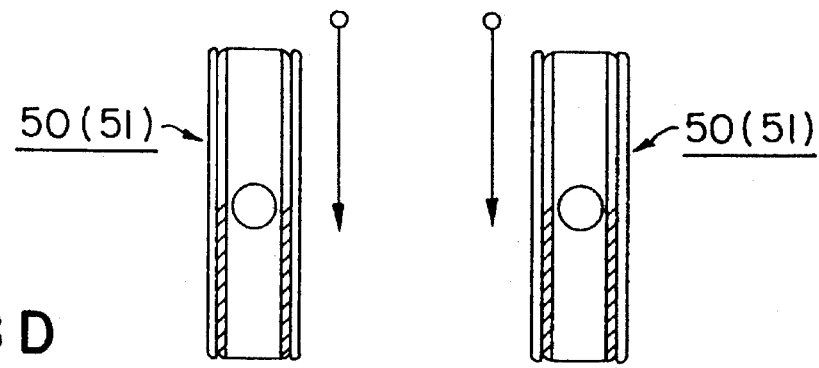
Figure 10:
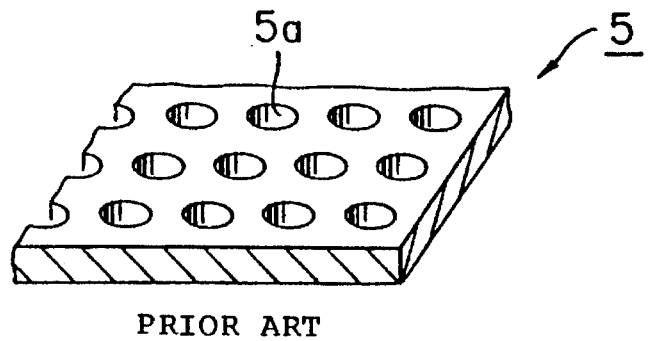
FIG. 10 is a partial perspective view of a conventional collimator with circular through-holes.
Figure 11:
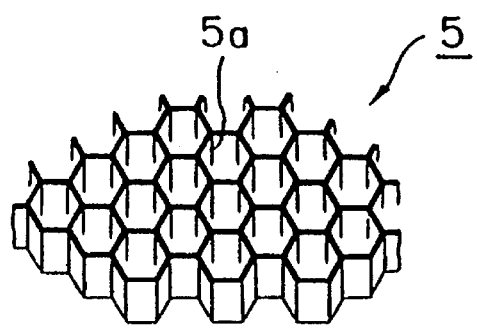
FIG. 11 is a partial perspective view of a conventional collimator with a honeycomb of through-holes.

To positively fix a titanium nitride film by a titanium film, the slats 50, 51, as shown in FIG. 8A, with the titanium film formed on the surfaces of the slats 50, 51 facing the target and with the titanium nitride film formed on the surfaces thereof facing the objects-to-be processed are rotated by 90°. Then, as shown in FIG. 8B, an adhesion layer of a titanium film is formed on one of the surfaces of the respective slats 50, 51 by the sputtering of titanium. Then as shown in FIG. 8C, the slats 50, 51 are further rotated by 180° to form an adhesion layer of a titanium film on the other surfaces of the slats 50, 51. Then as shown in FIG. 8D, the normal sputtering is resumed.

Otherwise, after the reactive sputtering of titanium nitride, the respective slats 50, 51 are located at their shielding positions, and the pre-sputtering of titanium is conducted for a longer time to form a titanium film on the surfaces of the slats 50, 51. It is also possible that the step of fixing a titanium nitride film is inserted, whereby particle prevention and the target cleaning-by the pre-sputtering are concurrently conducted, with a result of higher through-puts.

As described above, according to the present invention, the collimator can function as the shutter for the pre-sputtering. The collimator can be reversed, if necessary, between the side facing the target and that facing an object to be processed, so that a film of good adhesion, e.g., titanium, can be formed on a film of poor adhesion, e.g., titanium nitride, whereby generation of particles can be prevented or suppressed.

FIGS. 9A and 9B show another embodiment of the collimator of the present invention. The collimator according to the present embodiment includes slats 60 each having a plurality of comb teeth 61. Rotatable rods 62 are rotated by drive means (see FIG. 3) to reverse the respective slats 60 by 180° from their positions in FIG. 9A to those in FIG. 9b with a gap allowed between the slats 60 for the slats 60 to be rotated so as to replace the side of the collimator facing the target and that facing an object to be processed with each other. In the present embodiment, only the slats 60 and the comb teeth 61 can form through-holes for sputtering particles to pass through. In the present embodiment it is not necessary to lay the slats one on another as in the embodiment explained with reference to FIGS. 3 to 6. The collimator can be accordingly thinner.

As described above, the apparatus according to the present invention has been explained by means of one embodiment of the present invention in which a DC magnetron sputtering system is used. But the present invention is not limited to the above-described embodiment. The present invention is also applicable to various sputtering systems, such as high-frequency sputtering systems, opposed target sputtering systems, ECR sputtering systems, bias sputtering systems, etc. The present invention is not limited to sputtering systems but is applicable to all processing apparatuses including collimators for restricting the directions of sputtered particles. The present invention is not limited to formation of titanium/titanium nitride films but is applicable to sputtering of any material.

As described above, according to the present invention the collimator of the very simple structure can also provide a shutter for pre-sputtering, and, if necessary, a side of the collimator facing the target and that facing an object to be processed can be replaced with each other. For example, a film of good adhesion, e.g., titanium, is formed on a film of poor adhesion, titanium nitride, whereby generation of particles can be prevented or suppressed.

In other words, a side of the collimator facing the target and that facing an object to be processed are replaced with each other, so that adhesion of sputtered particles on the inside walls of the through-holes can be made uniform, and particles which easily peel off are covered with particles which are hard to peel off, whereby higher adhesion can be obtained. As a result, generation of particles caused by sputtered particles adhered to the collimator can be reduced or suppressed.

Especially, the use of the louver structure enables a side of the collimator facing the target and that facing an object-to-be-processed to be replaced with each other in a very small space, i.e., substantially in the space of a thickness of the collimator.

The collimator is arranged so as to restrict sputtered particles deflected not only in the X direction but also in the Y direction, whereby a reversible collimator structure with high step coverage can be provided.

The respective slats are arranged so as to close off the interior of the processing vessel between the side of the target and that of an object to be processed, whereby the reversible collimator can function as a shutter.

The reversible collimator structure is applied to a sputtering system for alternately conducting sputtering of titanium and reactive sputtering of titanium nitride, whereby a titanium nitride film formed on the side of the through-holes facing an object to be processed, which easily peels because of poor adhesion, is covered, after the collimator has been reversed, with a titanium film, which does not peel easily because of good adhesion. As a result, generation of particles caused by peeling of films of particles adhered to the collimator can be reduced or suppressed.

In actual sputtering, the collimator is reversed at a set timing to cover particles of poor adhesion with particles of good adhesion. Otherwise, with the respective slats located in their shielding position, particles of poor adhesion are covered with particles of good adhesion, whereby generation of particles can be reduced or suppressed. These operations are conducted in accordance with a preset time cycle or after a number of objects to be processed, whereby the particle preventing processing can be easier. The above-described operations are conducted when a counted value read by a particle counter reaches a set threshold value, whereby the particle preventing processing can be more accurate.

The respective slats are used as shielding means used at the beginning of sputtering, so that optimum ones of sputtering particles can be adhered to an object to be processed. As a result, yields of products can be higher. Especially in sputtering of titanium following reactive sputtering of titanium nitride, the respective slats are used as shielding means, whereby the effect of cleaning the surface of the target can be produced to make continuous processing for formation of a titanium film and a titanium oxide film possible.

What is claimed is:

1. A processing apparatus comprising a sputtering target arranged in a processing vessel so as to be opposed to an object to be processed; and a collimator arranged opposed to the target for restricting the directions of sputtered particles from the target so as to adhere the sputtered particles to the object to be processed, the collimator including reversing means which can reverse the collimator to replace a side thereof facing the target and a side thereof facing the object-to-be-processed with each other.

2. The processing apparatus according to claim 1, wherein the collimator comprises a plurality of slats arranged substantially parallel with each other, the respective slats constituting a louver mechanism in which rotatable rods are rotated to replace the side thereof facing to the target and the side thereof facing to the object-to-be-processed with each other.

3. The processing apparatus according to claim 2, wherein a plurality of sets of substantially parallel slats are arranged in a plurality of stages, each set being oriented in a direction different from that of its adjacent set.

4. The processing apparatus according to claim 2, wherein a plurality of substantially parallel slats have comb teeth.

5. The processing apparatus according to claim 2, wherein the respective slats are capable of passing through a shielding position where the respective slats close off the portion of the interior of the processing vessel belonging to the target from the portion thereof belonging to the object-to-be processed, being reversed, and stopped at the shielding position.

6. The processing apparatus according to claim 1, wherein the processing apparatus is a sputtering system which alternately conducts sputtering of titanium and reactive sputtering of titanium nitride.

7. A processing method comprising the steps of positioning an object-to-be-processed in a processing vessel, opposed to a sputtering target, and restricting the directions of particles sputtered from the target by a collimator opposed to the target, whereby the sputtered particles are adhered to the object-to-be-processed, the collimator being rotated at a set timing to replace the side of the collimator facing the target and the side thereof facing the object-to-be-processed with each other.

8. The processing method according to claim 7, wherein sputtering is conducted with the collimator being in the form of a plurality of slats kept at a shielding position at a set timing.

9. The processing method according to claim 8, wherein the slats are kept at the shielding position at the beginning of sputtering, and the slats are further rotated to be opened after sputtering has become stable.

10. The processing method according to claim 8, wherein when sputtering of titanium follows reactive sputtering of titanium nitride, the sputtering is conducted for a required period of time with the slats kept at the shielding position, and then the respective slats are further rotated so as to be opened.

11. The processing method according to claim 7, wherein the set timing is a set time cycle or a set number of objects to be processed.

12. The processing method according to claim 7, wherein the set timing is a time when a counted value read by a particle counter provided in the processing apparatus has exceeded a set threshold value.

* * * * *